US009153519B2

(12) United States Patent
Nagaune

(10) Patent No.: US 9,153,519 B2
(45) Date of Patent: Oct. 6, 2015

(54) SEMICONDUCTOR DEVICE FOR PREVENTING A PROGRESSION OF A CRACK IN A SOLDER LAYER AND METHOD OF MANUFACTURING THE SAME

(75) Inventor: Fumio Nagaune, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 14/110,935

(22) PCT Filed: May 11, 2012

(86) PCT No.: PCT/JP2012/062214
§ 371 (c)(1),
(2), (4) Date: Oct. 24, 2013

(87) PCT Pub. No.: WO2012/157583
PCT Pub. Date: Nov. 22, 2012

(65) Prior Publication Data
US 2014/0042609 A1 Feb. 13, 2014

(30) Foreign Application Priority Data

May 13, 2011 (JP) ................................. 2011-108718

(51) Int. Cl.
H01L 23/34 (2006.01)
H01L 21/50 (2006.01)
(Continued)

(52) U.S. Cl.
CPC ................ H01L 23/34 (2013.01); H01L 21/50 (2013.01); H01L 23/24 (2013.01); H01L 24/34 (2013.01);
(Continued)

(58) Field of Classification Search
CPC . H01L 23/34; H01L 24/73; H01L 224/73265; H01L 2924/01033; H01L 2924/014; H01L 2224/32225; H01L 2224/48227; H01L 2924/01029; H01L 24/45; H01L 224/45124; H01L 2224/85205
USPC ................ 257/692, 675, 687, 714, 706, 717, 257/E23.14, E23.044; 438/122
See application file for complete search history.

(56) References Cited

U.S. PATENT DOCUMENTS 4,970,570 A 11/1990 Agarwala et al.
5,539,253 A * 7/1996 Nagaune ....................... 257/687
(Continued)

FOREIGN PATENT DOCUMENTS

DE 3728096 C1 1/1989
JP S55-012728 A 1/1980
(Continued)

OTHER PUBLICATIONS

Japan Patent Office, "Office Action for JP 2013-515136," Sep. 16, 2014.
(Continued)

Primary Examiner — Alexander Oscar Williams
(74) Attorney, Agent, or Firm — Manabu Kanesaka

(57) ABSTRACT

A semiconductor device has a connection structure in which a power semiconductor chip is mounted on an insulating substrate having conductor patterns bonded to front and rear surfaces thereof and the insulating substrate is bonded to a heat-dissipating base member to dissipate heat generated from the power semiconductor chip to outside. The conductor pattern bonded to the heat-dissipating base member is formed such that a thickness of a circumferential portion of a bonding surface of the conductor pattern bonded to the insulating substrate is less than that of a center of the bonding portion.

14 Claims, 9 Drawing Sheets

(51) Int. Cl.
*H01L 23/00* (2006.01)
*H01L 23/24* (2006.01)
*H01L 23/36* (2006.01)
*H01L 23/498* (2006.01)
*H01L 23/373* (2006.01)

(52) U.S. Cl.
CPC ............... *H01L 24/49* (2013.01); *H01L 24/73* (2013.01); *H01L 23/36* (2013.01); *H01L 23/3735* (2013.01); *H01L 23/49811* (2013.01); *H01L 23/49833* (2013.01); *H01L 24/45* (2013.01); *H01L 24/48* (2013.01); *H01L 24/85* (2013.01); *H01L 2224/04026* (2013.01); *H01L 2224/04034* (2013.01); *H01L 2224/04042* (2013.01); *H01L 2224/32225* (2013.01); *H01L 2224/40227* (2013.01); *H01L 2224/45015* (2013.01); *H01L 2224/45124* (2013.01); *H01L 2224/48227* (2013.01); *H01L 2224/4903* (2013.01); *H01L 2224/49051* (2013.01); *H01L 2224/73221* (2013.01); *H01L 2224/73263* (2013.01); *H01L 2224/73265* (2013.01); *H01L 2224/85205* (2013.01); *H01L 2224/85214* (2013.01); *H01L 2224/85801* (2013.01); *H01L 2924/014* (2013.01); *H01L 2924/01029* (2013.01); *H01L 2924/01033* (2013.01); *H01L 2924/12041* (2013.01); *H01L 2924/30107* (2013.01)

(56) References Cited

U.S. PATENT DOCUMENTS

| | | | | |
|---|---|---|---|---|
| 7,569,929 | B2 * | 8/2009 | Mori et al. | 257/706 |
| 2004/0102023 | A1 | 5/2004 | Morozumi et al. | |
| 2014/0048918 | A1 * | 2/2014 | Nagaune | 257/675 |

FOREIGN PATENT DOCUMENTS

| | | | |
|---|---|---|---|
| JP | 2000-277557 A | | 10/2000 |
| JP | 2003-017627 A | | 1/2003 |
| JP | 2005-064441 A | | 3/2005 |
| JP | 2005-072098 A | | 3/2005 |
| JP | 2008-227336 A | * | 9/2008 |
| JP | 2009-190067 A | * | 8/2009 |
| JP | 2010-153785 A | * | 7/2010 |

OTHER PUBLICATIONS

Europe Patent Office, "Search Report for EP 12785684.7," Jun. 12, 2015.

* cited by examiner

SEMICONDUCTOR DEVICE FOR PREVENTING A PROGRESSION OF A CRACK IN A SOLDER LAYER AND METHOD OF MANUFACTURING THE SAME

RELATED APPLICATIONS

The present application is National Phase of International Application No. PCT/JP2012/062214 filed May 11, 2012, and claims priority from Japanese Applications No. 2011-108718 filed May 13, 2011.

TECHNICAL FIELD

The present invention relates to a semiconductor device that is intended for, for example, a power semiconductor module and a method of manufacturing the same, and more particularly, to a semiconductor device having a connection structure in which a power semiconductor chip is mounted on an insulating substrate and the insulating substrate is bonded to a heat-dissipating base member such that heat generated from the power semiconductor chip can be dissipated to the outside and a method of manufacturing the same.

BACKGROUND ART

In the semiconductor device which is intended for, for example, the power semiconductor module, with an increase in current capacity and the density of components and a reduction in the size of the module, the amount of current flowing through wiring lines in the package has increased and it is necessary to improve the radiation performance of the module. In addition, in many cases, a lead frame using a copper plate is used, instead of aluminum wire bonding according to the related art, in order to reduce wiring inductance.

FIGS. 6(A), 6(B) are a vertical cross-sectional view and a plan view illustrating a semiconductor device according to the related art.

FIG. 6(A) is a vertical cross-sectional view taken along the line A-A of FIG. 6(B). An insulating substrate 1 made of, for example, ceramic is a DBC (Direct Bonding Copper) substrate having conductor patterns 2a, 2b bonded to both surfaces thereof. In addition, a semiconductor chip 3 is mounted on the conductor pattern 2a which is formed as a copper circuit on the front surface of the insulating substrate 1 by soldering. The conductor pattern 2b, which has the same thickness as the conductor pattern 2a and is bonded to the rear surface of the insulating substrate 1, is bonded to a heat-dissipating base member 4 such that heat generated from the semiconductor chip 3 is dissipated to the outside. The heat-dissipating base member 4 forms the bottom of a resin case 5 and two large and small insulating substrates 1 are bonded to the heat-dissipating base member 4. The semiconductor chip 3, an internal connection terminal 7, and an aluminum wire 8 are protected by a gel-like sealing member 6 which is filled in the resin case 5.

FIG. 6(B) is a plan view illustrating the state of the semiconductor device before the sealing member 6 is filled. Metal electrodes 3a, 3b of the semiconductor chip 3 are internally connected to predetermined portions of the conductor pattern 2a by the internal connection terminal 7 and the aluminum wire 8. In addition, a plurality of external lead terminals 9a, 9b is drawn from the conductor pattern 2a to the upper surface of the resin case 5. The internal connection terminal 7 and the external lead terminals 9a, 9b are lead frames obtained by processing copper plates.

In the semiconductor device such as a module-type power semiconductor device, an intelligent power module, or a discrete semiconductor product, the metal electrodes 3a, 3b of the semiconductor chip 3 and the internal connection terminal 7 and also the internal connection terminal 7 and the conductor pattern 2a fixed to the insulating substrate 1 are wired inside the device, and the external lead terminals 9a, 9b are drawn to the outside of the device. In the semiconductor device, in general, the semiconductor chip 3 and the conductor pattern 2a, the conductor pattern 2b and the heat-dissipating base member 4, or the conductor pattern 2a and the internal connection terminal 7 or the external lead terminals 9a, 9b are connected to be wired by, for example, soldering, brazing, ultrasonic bonding, or laser welding. In addition, in general, components of the semiconductor device have a square shape or a rectangular shape and are formed by bonding metal materials with different thermal expansion coefficients.

Next, a crack which occurs when bonding members with different thermal expansion coefficients are bonded to each other by, for example, solder will be described.

In a case in which metal members with different thermal expansion coefficients are connected to each other, when the environmental temperature thereof repeatedly increases and decreases, the metal members are expanded and contracted at different rates. That is, stress is repeatedly applied to a fixing layer which is made of, for example, solder or a brazing filler metal and bonds the metal members and a crack is likely to occur in the fixing layer.

FIG. 7 is a cross-sectional view illustrating a state in which two metal members are bonded to each other by a solder fixing layer.

In FIG. 7, the X-axis represents the length direction of the members and the Y-axis represents the thickness direction of the members. It is assumed that first and second metal members 11, 12 have different thermal expansion coefficients $\alpha1$, $\alpha2$ ($\alpha1<\alpha2$) and have longitudinal elastic moduli E1, E2, respectively. In addition, it is assumed that a fixing layer 13 is a solder layer with a shear elastic modulus Gc and has a thickness h.

As illustrated in FIG. 7, a solder fillet is formed in an outer circumferential portion of the fixing layer 13, in a state in which the second metal member 12 is bonded to the first metal member 11 through the fixing layer 13 made of solder. In general, it has been known that the second metal member 12 with a length L and a thickness t2 is bonded to the first metal member 11 with a thickness t1 and the shear strain rate ($\Delta\gamma$) of the solder of the fixing layer 13 when a temperature variation of T[° C.] occurs in the bonded structure is calculated by the following Expression 1.

$$\Delta\gamma \approx (L/2) \cdot (\alpha2-\alpha1) \cdot T / \{(\sqrt{A}) \cdot h\} \qquad \text{[Expression 1]}$$

(where, a coefficient A is $Gc/h \cdot \{1/(E2 \cdot t2)+1/(E1 \cdot t1)\}$).

According to Expression 1, as the thicknesses t1, t2 of the first and second metal members 11, 12 and the length L of the second metal member 12 increase, stress is applied to the fixing layer 13 at a larger shear strain rate $\Delta\gamma$. In addition, as it can be seen from Expression 1, as the thickness h of the fixing layer 13 made of solder is reduced, the shear strain rate $\Delta\gamma$ increases. Therefore, as the thickness of the fixing layer 13 made of solder is reduced, a crack is more likely to occur in the fixing layer 13 made of solder.

FIGS. 8(A), 8(B) are the ultrasound pictures of a crack which occurs in the solder fixing layer in the temperature cycle test. FIGS. 8(A), 8(B) illustrate cracks which occur when components are repeatedly expanded and contracted in, for example, the temperature cycle reliability test in a state in which the conductor patterns 2b formed on the rear surfaces of the two large and small insulating substrates 1 illustrated in FIGS. 6(A), 6(B) are fixed to the heat-dissipating base member 4 by soldering.

In FIGS. 8(A), 8(B), the progression direction of the crack which occurs in each of the fixing layers 13a, 13b is represented by an arrow. In the ultrasound picture of the fixing layer 13a illustrated in FIG. 8(A), which has a square shape in a plan view, a region corresponding to a portion of the solder in which a crack occurs is represented as a large white area.

As above, in the semiconductor device in which the lower surface of the conductor pattern 2b corresponding to the metal member 12 illustrated in FIG. 7 is soldered to the heat-dissipating base member 4 corresponding to the metal member 11, a large shear strain occurs at the corners of the fixing layer 13, which causes a crack to occur from the corners to the center of the bonding portion. When the crack, which occurred at the corners of the insulating substrate 1, reaches a bonding surface to the semiconductor chip 3, a heat flux from the insulating substrate 1 to the heat-dissipating base member 4 is blocked by the crack. Therefore, the radiation performance of the semiconductor chip 3 for radiating the generated heat deteriorates. As a result, the junction temperature of an element abnormally increases, which leads to thermal fracture.

The following Patent Literature 1 discloses a semiconductor device with the following connection structure. When the thickness of a solder layer is small, fatigue breakdown occurs rapidly due to thermal stress which is applied to a soldering portion due to the difference in thermal expansion between an insulating substrate and a lead frame due to a heat cycle in a usage environment. Therefore, a protrusion is formed on a soldering surface of the copper circuit pattern of the lead frame or the insulating substrate to prevent a variation in the thickness of the solder layer.

Furthermore, Patent Literature 2 discloses a structure in which, in order to reduce stress applied to a bonding portion, chamfered portions are formed at four corners of a substrate or a slit is formed in a conductor pattern. In this structure, thermal stress which is applied to the bonding portion due to a thermal cycle is reduced to increase the time until a crack occurs, thereby preventing the growth of the crack.

CITATION LIST

Patent Document

Patent Document 1: Japanese Patent No. 4100685 (see paragraphs [0008] to [0014])
Patent Document 2: Japanese Patent No. 4124040 (see paragraphs [0024] to [0071])

DISCLOSURE OF THE INVENTION

Problem to be Solved by the Invention

FIG. 9 is a cross-sectional view illustrating the semiconductor device according to the related art taken along the line IX-IX of FIG. 6(A).

In the semiconductor device intended for, for example, a power semiconductor module, in general, the conductor pattern 2b bonded to the heat-dissipating base member 4 has a square shape or a rectangular shape, as illustrated in FIG. 9. In addition, in general, when a wiring line is formed between a semiconductor chip and a metal terminal, between metal materials, or between the metal terminal and a metal pattern fixed to an insulating substrate, each of the components connected to each other has a shape corresponding to the outer shape of the module and has a square shape or a rectangular shape. Therefore, when the semiconductor chip and the metal terminal, or metal materials with different thermal expansion coefficients are connected to each other by soldering or brazing, the components have different thermal expansion coefficients in, for example, the temperature cycle reliability test and stress which occurs along the bonding surface is concentrated on an angular corner. Therefore, a solder layer or a brazing filler metal layer is likely to be broken or cracked.

As such, shear stress is likely to be concentrated on the corners of a component having a square shape or a rectangular shape, which causes a crack to occur from the corners. The growth of the crack which occurs in the bonding surface reduces the radiation performance of the semiconductor device, which makes it difficult to dissipate heat generated from, particularly, a power semiconductor module to the outside. Finally, a serious problem of thermal fracture occurring in the semiconductor device arises.

The invention has been made in view of the above-mentioned problems and an object of the invention is to provide a semiconductor device which is capable of reducing the concentration of stress on the corners of a bonding portion to suppress or prevent the progression of a crack in a solder layer in, for example, a temperature cycle reliability test and a method of manufacturing the same.

Means for Solving Problem

In order to solve the above-mentioned problems, according to the invention, there is provided a semiconductor device having a connection structure in which a power semiconductor chip is mounted on an insulating substrate having conductor patterns bonded to front and rear surfaces thereof and the insulating substrate is connected to a heat-dissipating base member to dissipate heat generated from the power semiconductor chip to the outside. In the semiconductor device, of the conductor patterns, the conductor pattern bonded to the heat-dissipating base member is formed such that the thickness of a circumferential portion of a bonding surface of the conductor pattern bonded to the insulating substrate is less than that of a center of the bonding portion.

In addition, according to the invention, there is provided a method of manufacturing a semiconductor device having a connection structure in which a power semiconductor chip is mounted on an insulating substrate and the insulating substrate is bonded to a heat-dissipating base member to dissipate heat generated from the power semiconductor chip to outside. The method includes: bonding conductor patterns to front and rear surfaces of the insulating substrate, the conductor pattern on the rear surface of the insulating substrate being formed such that the thickness of the circumference of a bonding portion is less than that of the center of the bonding portion; providing sheet-shaped solder that has a planar shape same as the conductor pattern and has a predetermined thickness between the heat-dissipating base member and the conductor pattern and heating the sheet-shaped solder; and solidifying the sheet-shaped solder to form a solder fixing layer that connects the conductor pattern to the heat-dissipating base member.

Effect of the Invention

According to the invention, the thickness of an outer circumferential portion of the fixing layer made of, for example, solder is more than that of the center of the bonding portion of the conductor pattern. In this way, stress applied to the fixing layer is set to be reduced to an elastic limit or less and it is possible to suppress or prevent the occurrence of a crack in the fixing layer. Therefore, the radiation performance of the semiconductor device which is used under harsh temperature conditions is ensured and it is possible to increase the lifespan of the semiconductor device.

The above and other objects, features, and advantages of the invention will become more apparent by the following description associated with the accompanying drawings illustrating preferred embodiments of the invention.

BRIEF DESCRIPTION OF DRAWINGS

FIGS. 1(A), 1(B) are diagrams illustrating a semiconductor device according to a first embodiment of the invention, wherein FIG. 1(A) is a vertical cross-sectional view illustrating the semiconductor device and FIG. 1(B) is a plan view illustrating the semiconductor device.

BEST MODE(S) FOR CARRYING OUT THE INVENTION

Figure 1A:
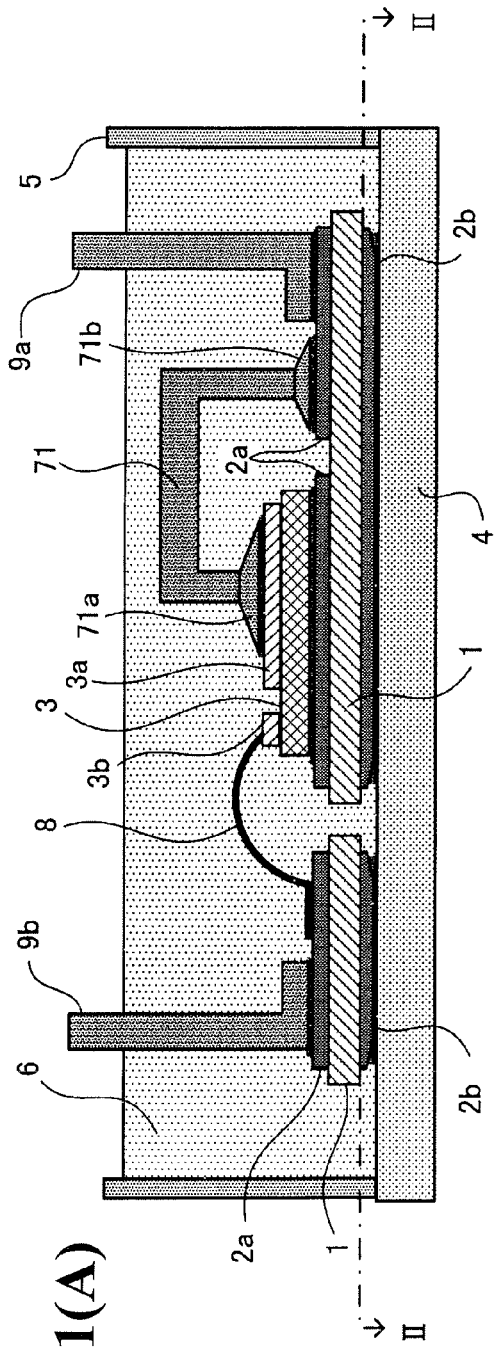
Figure 1B:
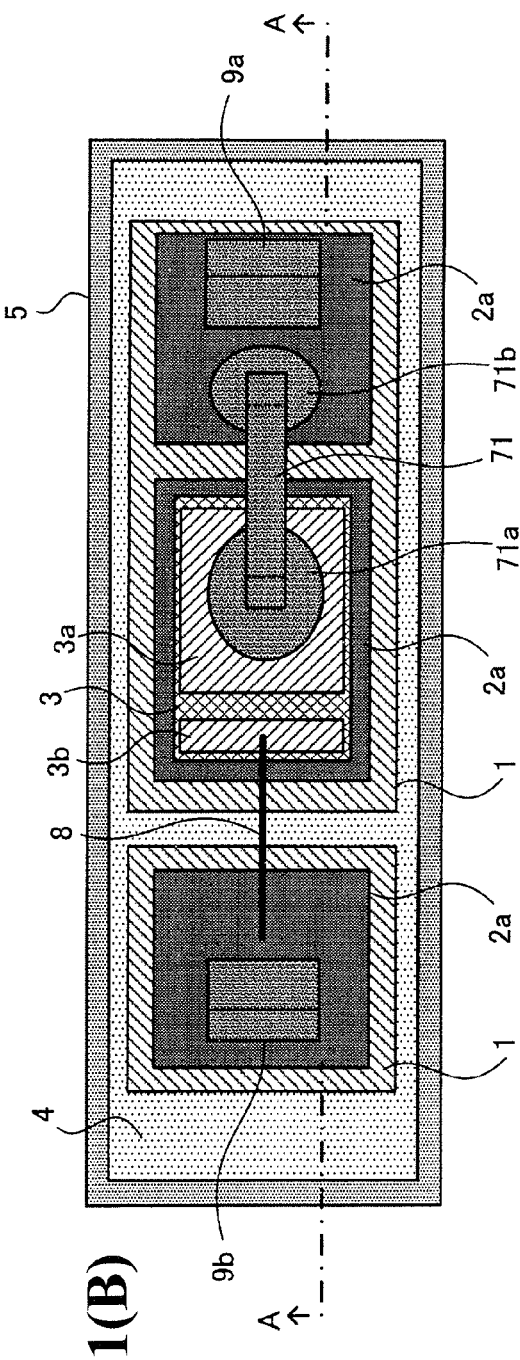

Hereinafter, embodiments of the invention will be described with reference to the accompanying drawings. FIGS. 1(A), 1(B) are diagrams illustrating a semiconductor device according to a first embodiment of the invention. FIG. 1(A) is a vertical cross-sectional view illustrating the semiconductor device and FIG. 1(B) is a plan view illustrating the semiconductor device.

Figure 6A:
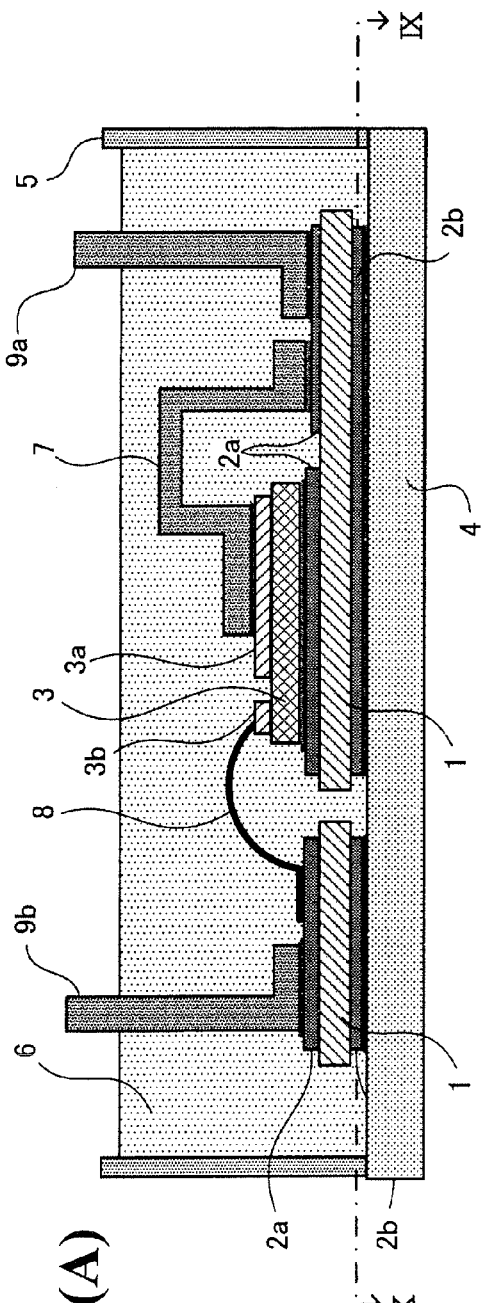
FIGS. 6(A), 6(B) are a vertical cross-sectional view and a plan view illustrating a semiconductor device according to the related art.
Figure 6B:
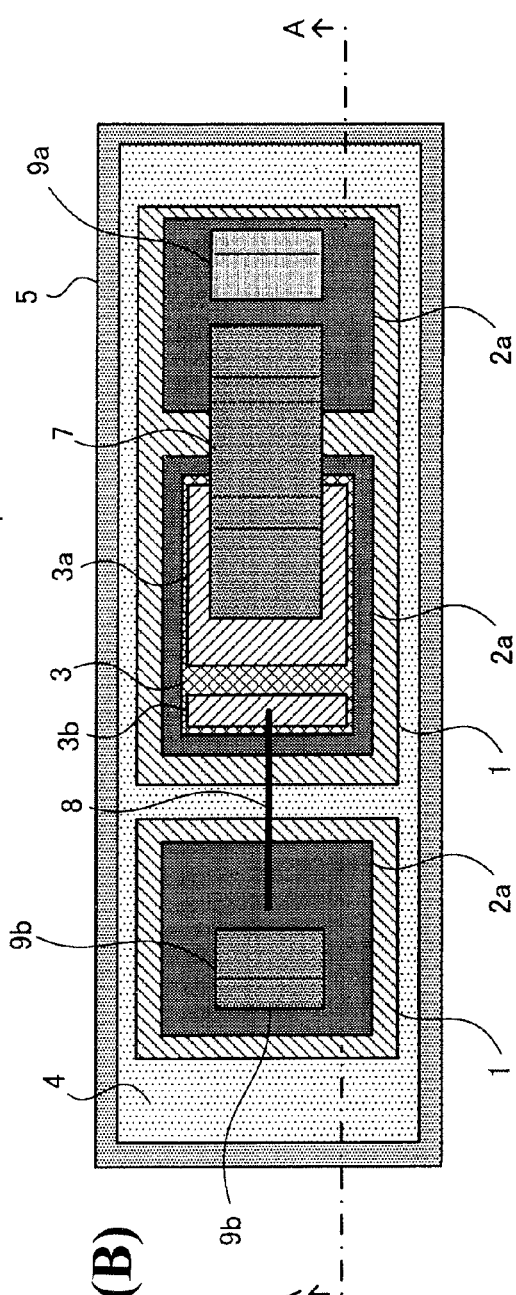

In the power semiconductor device illustrated in the figure, a semiconductor chip 3 is mounted on an insulating substrate 1 having conductor patterns 2a, 2b bonded to the front and rear surfaces thereof, and the insulating substrate 1 is bonded to a heat-dissipating base member 4. In this way, it is possible to dissipate heat generated from the semiconductor chip 3 to the outside. In addition, in the power semiconductor device, external lead terminals 9a, 9b, which are lead frames of copper plates, are bonded to the conductor pattern 2a on the front surface of the insulating substrate 1 on which the semiconductor chip 3 is mounted. The power semiconductor device includes an internal connection conductor 71 which connects a metal electrode 3a of the semiconductor chip 3 and the conductor pattern 2a. The connection structure is the same as that of the device according to the related art illustrated in FIG. 6.

Figure 2:
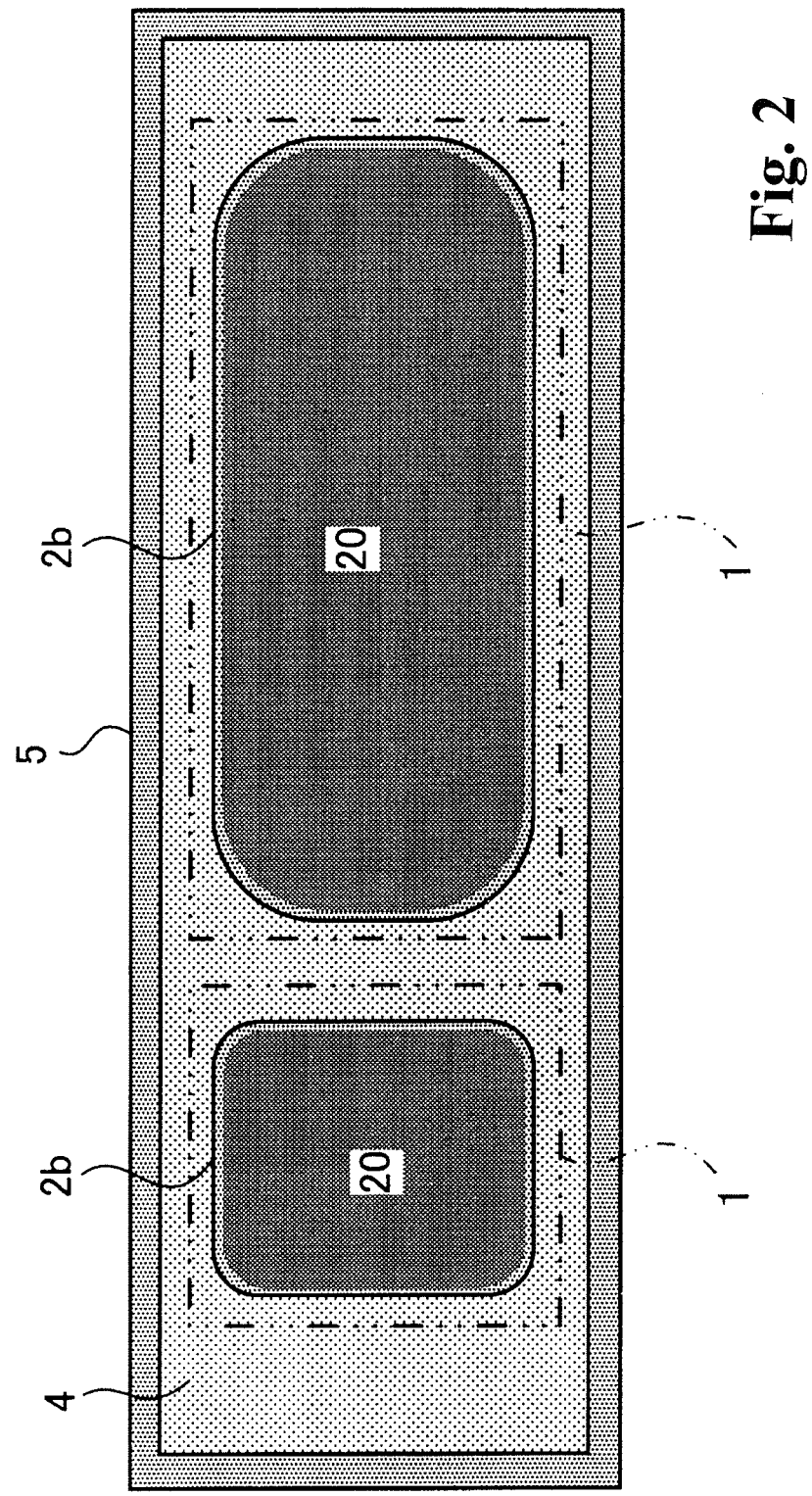
FIG. 2 is a cross-sectional view taken along the line II-II of FIG. 1.

The first characteristic of the power semiconductor device is that, of the conductor patterns 2a, 2b, the conductor pattern 2b which is bonded to the heat-dissipating base member is formed such that the thickness of a circumferential portion of a bonding surface to the insulating substrate 1 is less than that of the center of the bonding portion and a surface bonded to the heat-dissipating base member 4 is inclined, the corners of the conductor pattern 2b bonded to the heat-dissipating base member 4 are rounded, and the edge of the corner is a curved surface, as illustrated in FIG. 2 to be described below. In this way, the concentration of stress on the circumferential portion is reduced and the occurrence of a crack in the solder fixing layer between the heat-dissipating base member 4 and the conductor pattern is prevented. The second characteristic of the power semiconductor device is that the outer shape of bonding portions 71a, 71b of the internal connection conductor 71 is a curved shape which is exemplified by a circular shape and the thickness of the bonding portions 71a, 71b is continuously reduced from the side on which the internal connection conductor 71 is connected and which is opposite to a bonding surface to the circumference thereof.

That is, the thickness of each of the bonding portions 71a, 71b of the internal connection conductor 71 is continuously reduced such that the thickness of a circumferential portion of the bonding portion is less than that of the center of the bonding portion. When bonding portions of the external lead terminals 9a, 9b are directly drawn from the metal electrode 3a of the semiconductor chip 3, it is preferable that the external lead terminals 9a, 9b be drawn through the bonding portions which are formed such that the thickness of a circumferential portion of the bonding portion is less than that of the center of the bonding portion, similarly to the internal connection conductor 71.

FIG. 2 is a cross-sectional view taken along the line II-II of FIGS. 1(A), 1(B).

FIG. 2 illustrates two conductor patterns 2b which are bonded to the heat-dissipating base member 4, of the conductor patterns 2a, 2b. Each of the two conductor patterns 2b has a rectangular pattern shape in which corners are rounded and an inclined plane illustrated in FIG. 3, which will be described below, is formed in the circumference of the bonding portion to the insulating substrate 1. In FIG. 2, an aspect in which the thickness of each conductor pattern is less than that of the center 20 of the bonding portion is represented by a difference in the density of the pattern.

Figure 3:
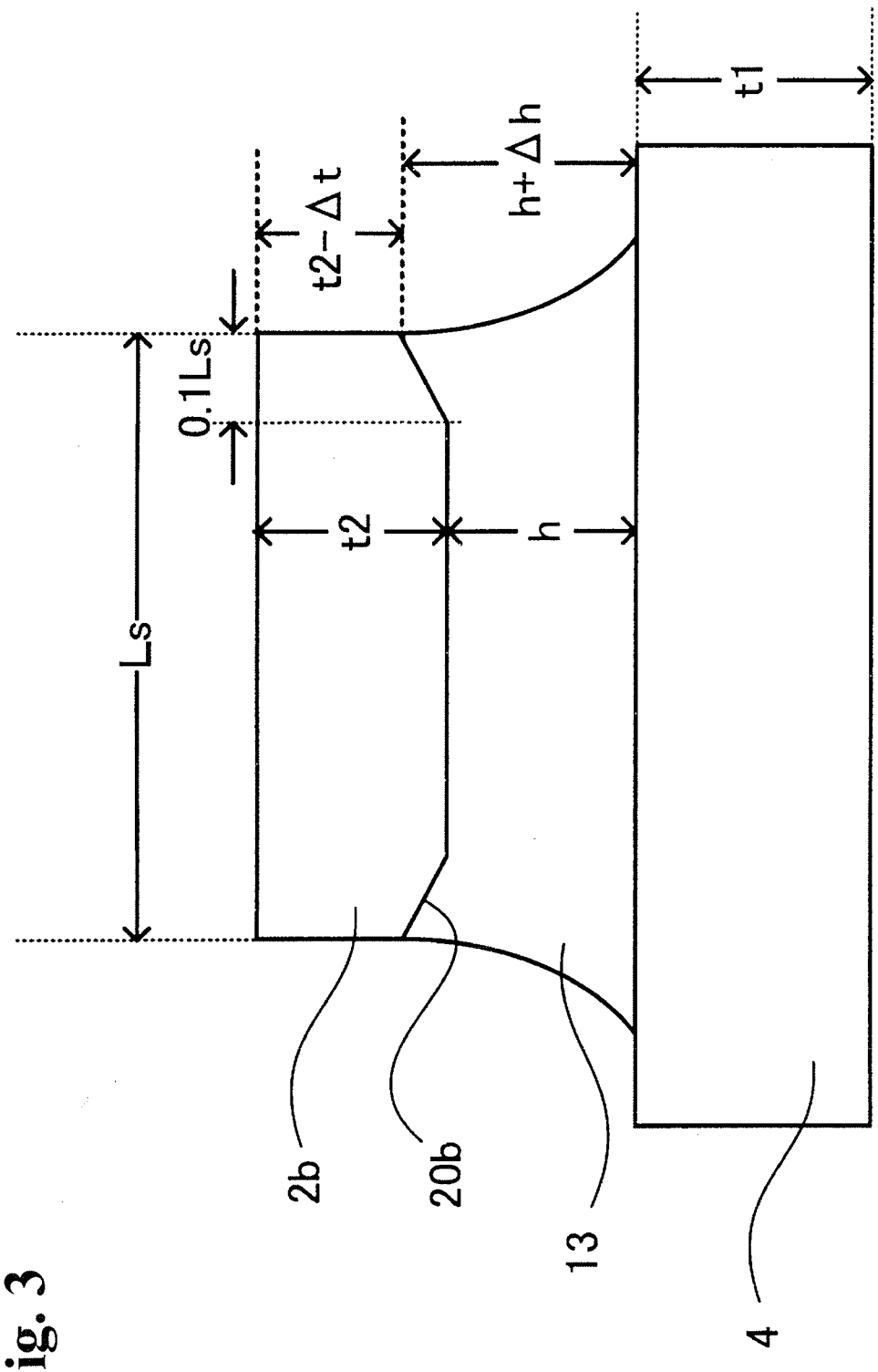
FIG. 3 is an enlarged cross-sectional view illustrating a solder fixing layer and a bonding portion thereof illustrated in FIGS. 1(A), 1(B).

FIG. 3 is an enlarged cross-sectional view illustrating the solder fixing layer and the bonding portion illustrated in FIG. 1.

Figure 7:
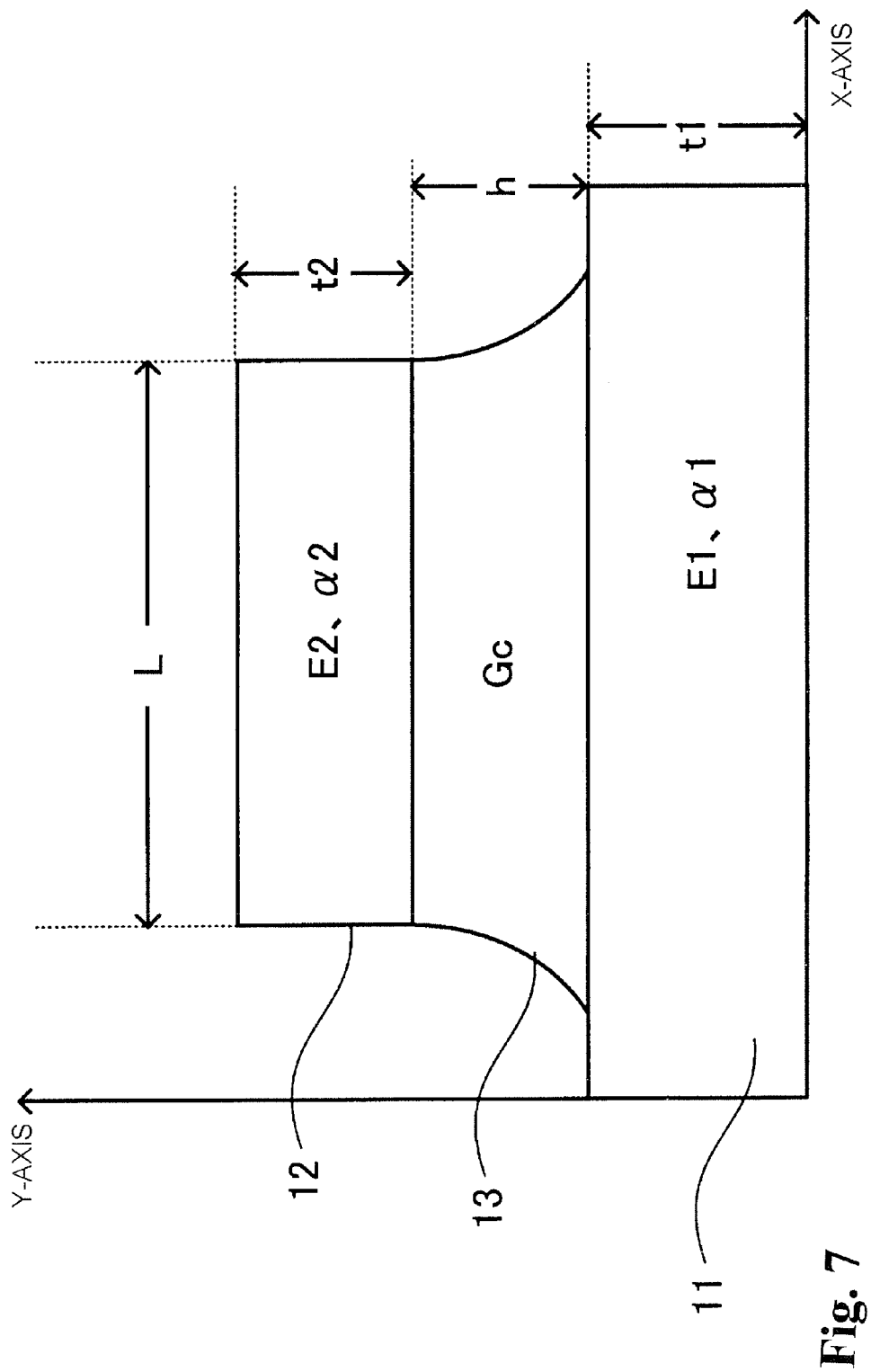
FIG. 7 is a cross-sectional view illustrating a state in which two metal members are bonded to each other by a solder fixing layer.
Figure 8A:
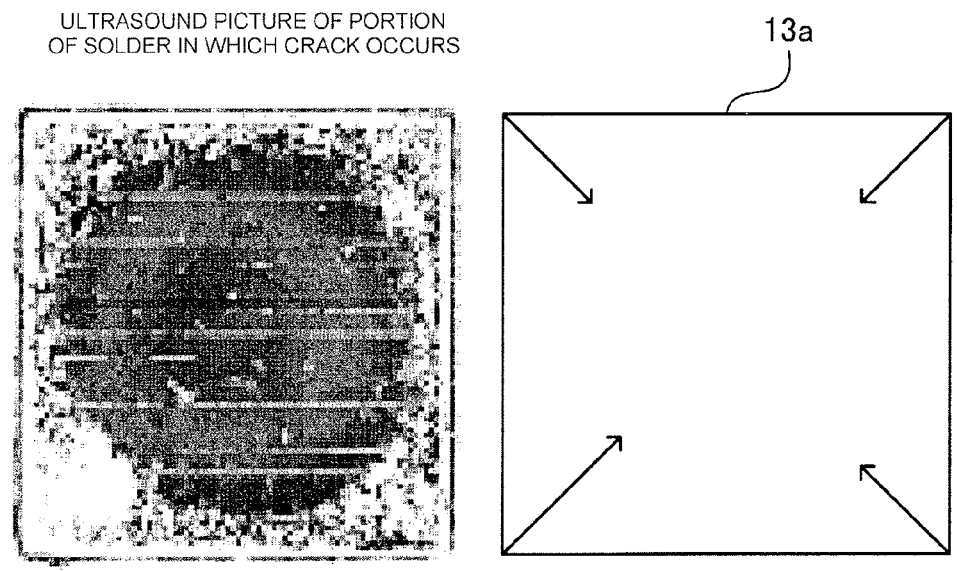
FIGS. 8(A), 8(B) are ultrasound pictures of a crack which occurs in the solder fixing layer in the temperature cycle test.
Figure 8B:
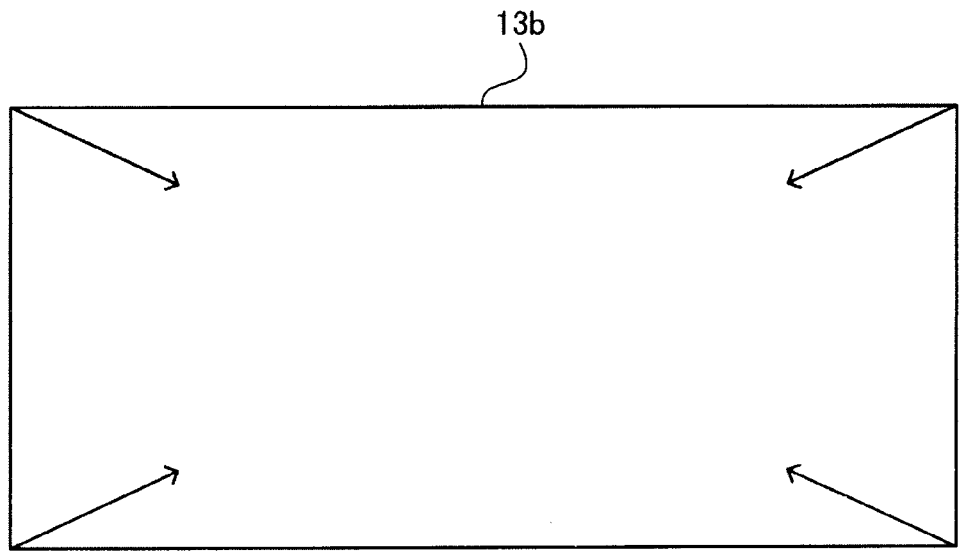
Figure 9:
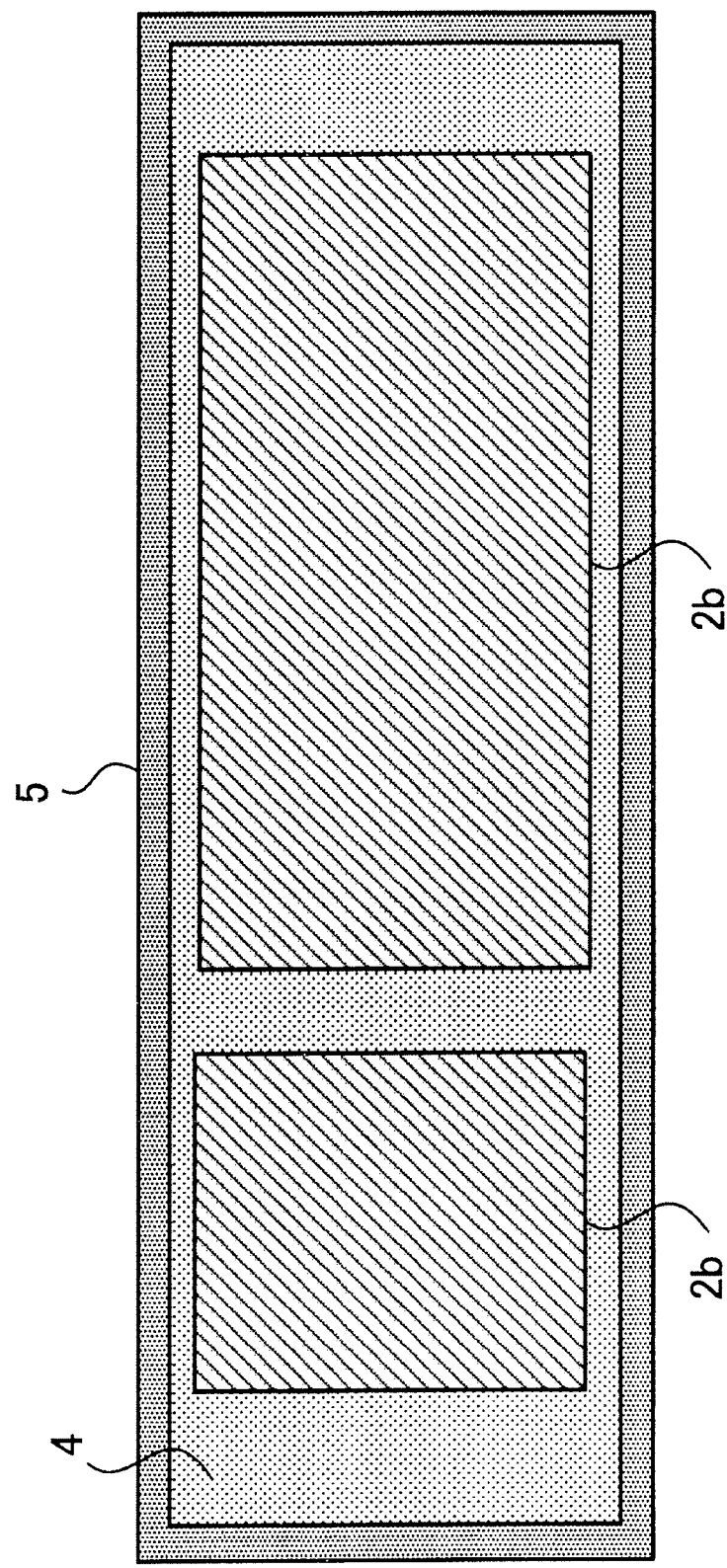
FIG. 9 is a cross-sectional view illustrating the semiconductor device according to the related art taken along the line IX-IX of FIG. 6(A).

The conductor pattern 2b (second metal member 12) is bonded to the heat-dissipating base member 4 (corresponding to a first metal member 11 illustrated in FIG. 7) through the solder fixing layer 13. According to the above-mentioned Expression 1, as the thicknesses (t1 and t2) of the first and second metal members 11, 12 and the length (L) of the second metal member 12 increase, stress is applied to the fixing layer 13 at a larger shear strain rate $\Delta\gamma$. In addition, according to Expression 1, as the thickness (h) of the fixing layer 13 is reduced, the shear strain rate $\Delta\gamma$ increases.

That is, for the conductor pattern 2b, since an inclined plane 20b is formed in the circumference of the bonding portion to the insulating substrate 1, the thickness of the circumference of the bonding portion is less than that of the center 20 of the bonding portion by $\Delta t$. Therefore, since the circumference of the bonding portion of the fixing layer 13 has a larger thickness h+$\Delta$h ($\Delta$h=$\Delta$t), the shear strain rate $\Delta\gamma$ is reduced by a value corresponding to the difference. When the fixing layer 13 is formed by soldering, the thickness h of the center of the fixing layer is in the range of about 200 μm to 400 μm, which is obtained from reliable experiments and simulations. For the thickness h in the above-mentioned range, when the length of the conductor pattern 2b in a short-length direction of the lengths L of the conductor pattern 2b in the horizontal and vertical directions is Ls, it is preferable that the bonding portion of the conductor pattern 2b be inclined in the range of a predetermined width (k×Ls) (where, k is in the range of 0.05 to 0.2) from the circumference of the conductor pattern 2b such that the thickness of the circumference of the bonding portion of the fixing layer 13 at the end of the conductor pattern is increased by 2h. In addition, the corners of the conductor pattern 2b are rounded to reduce the length L of the second metal member 12. In this way, the shear strain rate Δγ acting on the fixing layer 13 is reduced. Therefore, stress applied to the fixing layer 13 is set to be reduced to an elastic limit or less and it is possible to suppress or prevent the occurrence of a crack in the fixing layer 13.

Figure 4:
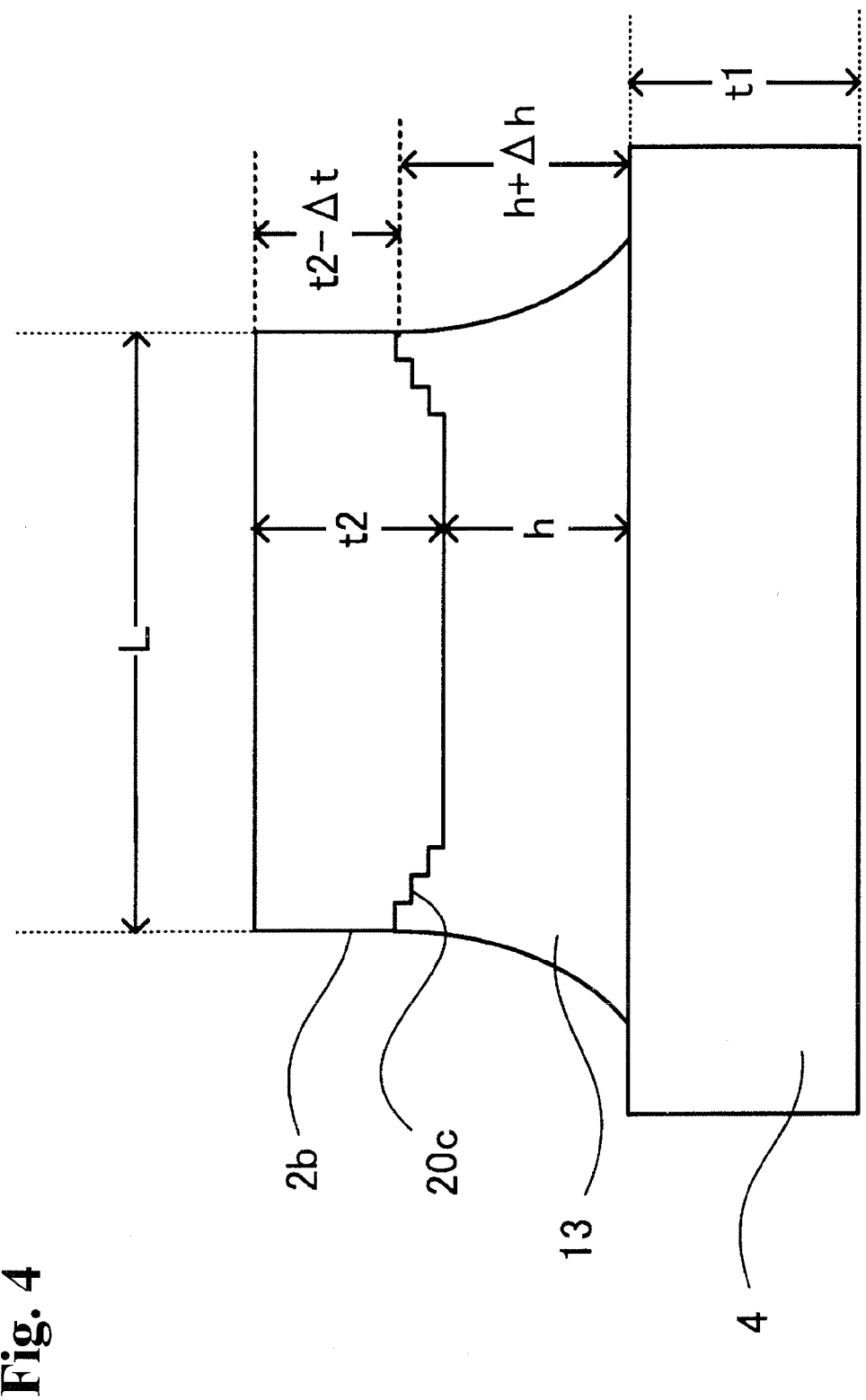
FIG. 4 is a cross-sectional view illustrating a solder fixing layer and a bonding portion thereof in a method of manufacturing another semiconductor device.

In a method of manufacturing the power semiconductor device, first, a step is performed which bonds the conductor patterns 2a, 2b to both surfaces of the insulating substrate 1 and forms the conductor pattern 2b on the rear surface of the insulating substrate 1 such that the thickness of the circumference of the bonding portion is less than that of the center 20 of the bonding portion. This step is implemented by forming the conductor pattern 2b with the same thickness and grinding or etching the inclined plane 20b, or pressing the conductor pattern 2b having the inclined plane 20b. In addition, as illustrated in FIG. 4, a step-shaped circumferential portion 20c may be formed in the conductor pattern 2b having the inclined plane 20b by the same processes as described above.

Then, sheet-shaped solder which has the same planar shape as the conductor pattern 2b and has a predetermined thickness is provided between the heat-dissipating base member 4 and the conductor pattern 2b and is heated. Then, the molten sheet-shaped solder is solidified to form a solder fixing layer which connects the conductor pattern 2b to the heat-dissipating base member 4. In addition, the conductor pattern 2b may be bonded to the heat-dissipating base member 4 by brazing.

Figure 5A:
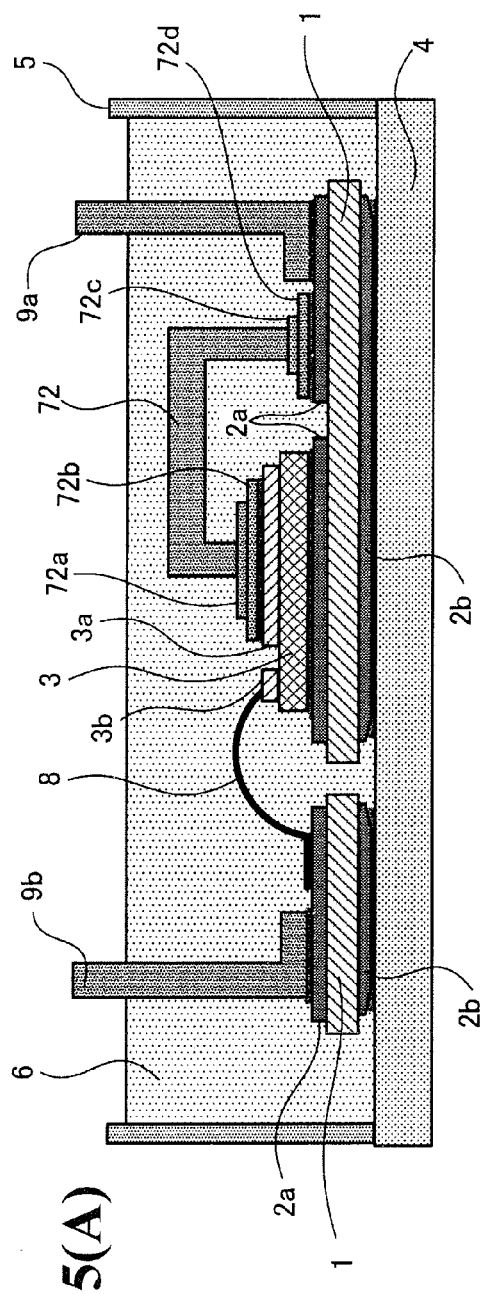
FIGS. 5(A), 5(B) are a plan view and a vertical cross-sectional view illustrating a semiconductor device according to a second embodiment of the invention.
Figure 5B:
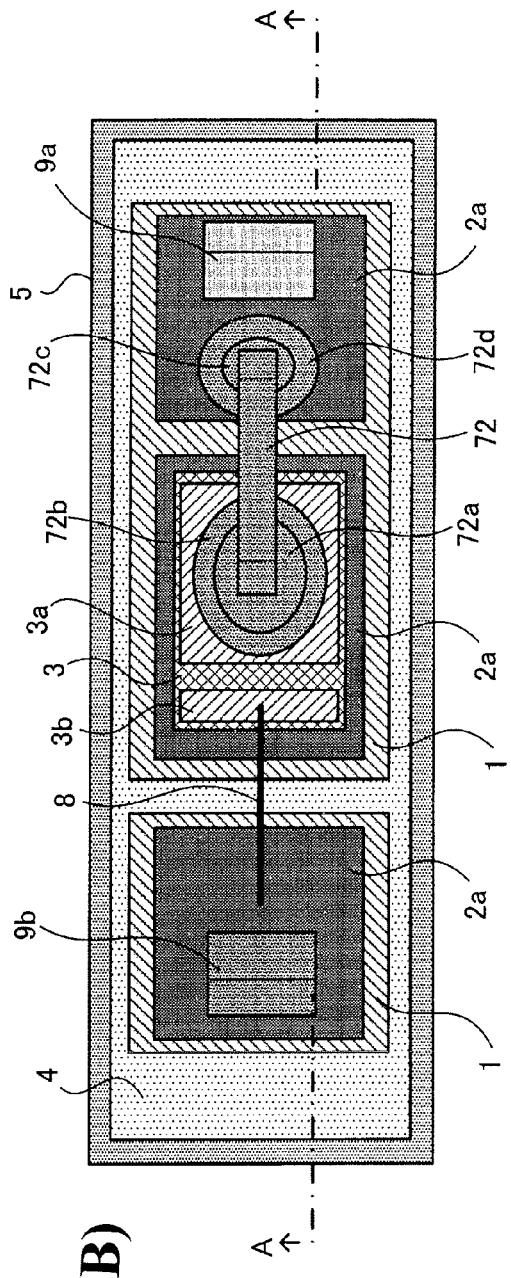

FIGS. 5(A), 5(B) are a plan view and a vertical cross-sectional view illustrating a semiconductor device according to a second embodiment of the invention.

In the semiconductor device, a bonding portion 72b of an internal connection conductor 72 is fixed to a metal electrode 3a of a semiconductor chip 3 through a thick connection portion 72a and the internal connection conductor 72 is fixed to a conductor pattern 2a by a bonding portion 72d through a thick connection portion 72c. That is, the bonding portions 72b, 72d of the internal connection conductor 72 are formed such that the thickness thereof is reduced stepwise from the thick connection portions 72a, 72c formed at the center of the bonding portions. The thick connection portions 72a, 72c and the bonding portions 72b, 72d have an elliptical shape in a plan view. The planar shape of the thick portions is not limited to the elliptical shape. The thick portions may have any planar shape in which an angular portion thereof is curved. In this case, the effect of the invention is obtained.

According to the above-mentioned Expression 1, the thickness t2 of the bonding portions 72b, 72d corresponding to the second metal member 12 is less than that of an outer circumferential portion of the fixing layer 13. Therefore, the shear strain rate Δγ of the bonding portion is reduced and it is possible to reduce stress applied to the fixing layer 13 which bonds the internal connection conductor 72 to the metal electrode 3a of the semiconductor chip 3 or the conductor pattern 2a. In addition, the length L of the bonding portions 72b, 72d corresponding to the second metal member 12 is reduced, which contributes to reducing the shear strain rate Δγ acting on the fixing layer 13.

When bonding portions of the external lead terminals 9a, 9b are directly drawn from the metal electrode 3a of the semiconductor chip 3, it is preferable that the bonding portions be formed such that the thickness of a circumferential portion of the fixing layer is less than that of the center of the bonding portion, similarly to the internal connection conductor 71.

Only the principle of the invention has been described above. Various modifications and changes of the invention can be made by those skilled in the art. The invention is not limited to the above-mentioned structures and applications, but all of the corresponding modifications and equivalents fall within the scope of the invention defined by the appended claims and equivalents thereof.

EXPLANATIONS OF LETTERS OR NUMERALS

1 INSULATING SUBSTRATE
2a, 2b CONDUCTOR PATTERN
3 SEMICONDUCTOR CHIP
4 HEAT-DISSIPATING BASE MEMBER
5 RESIN CASE
6 SEALING MEMBER
7 INTERNAL CONNECTION TERMINAL
8 ALUMINUM WIRE
9a, 9b EXTERNAL LEAD TERMINAL
11 FIRST METAL MEMBER
12 SECOND METAL MEMBER
13, 13a, 13b SOLDER FIXING LAYER
20b INCLINED PLANE
20c STEP-SHAPED CIRCUMFERENTIAL PORTION
71, 72 INTERNAL CONNECTION CONDUCTOR
71a, 71b, 72b, 72d BONDING PORTION
72a, 72c THICK CONNECTION PORTION

What is claimed is:
1. A semiconductor device comprising:
an insulating substrate having first and second conductor patterns, each having a bonding portion, the first conductor pattern being bonded to a front surface thereof and the second conductor pattern having four corner portions and being bonded to a rear surface thereof, a power semiconductor chip mounted on the first conductor pattern, and a heat-dissipating base member bonded to the second conductor pattern to dissipate heat generated from the power semiconductor chip to outside,
wherein the second conductor pattern is formed such that a circumferential portion of the bonding portion of the second conductor pattern has a thickness less than that of a center of the bonding portion thereof, and the second conductor pattern has a curved surface at each of the four corner portions such that a circumference of each of the four corner portions is outwardly curved.
2. The semiconductor device according to claim 1, wherein the second conductor pattern has a rectangular shape; and
the circumferential portion of the bonding portion of the second conductor pattern has a predetermined width from a circumference thereof, the predetermined width being a width multiplying a length in a short-length direction of the second conductor pattern by constant k in a range of 0.05 to 0.2, and the thickness of the circumferential portion of the bonding portion is continuously reduced.

3. The semiconductor device according to claim 1, wherein the second conductor pattern has a rectangular shape; and the circumferential portion of the bonding portion of the second conductor pattern has a predetermined width from a circumference thereof, the predetermined width being a width multiplying a length in short-length direction of the second conductor pattern by constant k in a range of 0.05 to 0.2, and the thickness of the circumferential portion of the bonding portion is reduced stepwise.

4. The semiconductor device according to claim 1, further comprising:

an external lead terminal having a bonding portion and bonded to a front surface of the first conductor pattern, wherein the bonding portion of the external lead terminal is formed such that a circumferential portion of the bonding portion of the external lead terminal has a thickness less than that of a center of the bonding portion thereof, and a circumference of the bonding portion of the external lead terminal is rounded.

5. The semiconductor device according to claim 4, wherein the bonding portion of the external lead terminal is formed such that the thickness thereof is continuously reduced in a circumferential direction.

6. The semiconductor device according to claim 4, wherein the bonding portion of the external lead terminal is formed such that the thickness thereof is reduced stepwise in a circumferential direction.

7. The semiconductor device according to claim 1, further comprising:

an internal connection terminal having a bonding portion at each end thereof and connecting a front electrode of the power semiconductor chip and the first conductor pattern, wherein each bonding portion of the internal connection terminal is formed such that a circumferential portion of each bonding portion of the internal connection terminal has a thickness less than that of the center of the bonding portion thereof, and a circumference of each bonding portion of the internal connection terminal is rounded.

8. The semiconductor device according to claim 7, wherein each bonding portion of the internal connection terminal is formed such that the thickness thereof is continuously reduced in a circumferential direction.

9. The semiconductor device according to claim 7, wherein each bonding portion of the internal connection terminal is formed such that the thickness thereof is reduced stepwise in a circumferential direction.

10. A method of manufacturing a semiconductor device having an insulating substrate having conductor patterns, a power semiconductor chip mounted on the insulating substrate, and a heat-dissipating base member bonded to the insulating substrate to dissipate heat generated from the power semiconductor chip to outside, comprising:

bonding the conductor patterns to front and rear surfaces of the insulating substrate;

forming the conductor pattern on the rear surface of the insulating substrate such that a circumferential portion of a bonding portion of the conductor pattern on the rear surface has a thickness less than that of a center of the bonding portion thereof, and forming a curved surface at each corner portion of the conductor pattern on the rear surface such that a circumference of each corner portion thereof is outwardly curved;

providing a sheet-shaped solder having a planar shape same as the conductor pattern on the rear surface and a predetermined thickness between the heat-dissipating base member and the conductor pattern on the rear surface, and heating the sheet-shaped solder; and solidifying the sheet-shaped solder to form a solder fixing layer connecting the conductor pattern on the rear surface to the heat-dissipating base member.

11. A method of manufacturing a semiconductor device having an insulating substrate having conductor patterns, a power semiconductor chip mounted on the insulating substrate, and a heat-dissipating base member bonded to the insulating substrate to dissipate heat generated from the power semiconductor chip to outside, comprising:

bonding the conductor patterns to front and rear surfaces of the insulating substrate, forming the conductor pattern on the rear surface of the insulating substrate is such that the conductor pattern on the rear surface has a predetermined width from a circumference thereof, the predetermined width being a width multiplying a length in a short-length direction of the conductor pattern on the rear surface by constant k in a range of 0.05 to 0.2, and a circumferential portion of a bonding portion of the conductor pattern on the rear surface has a thickness less than that of a center of the bonding portion thereof; and brazing to bond the conductor pattern on the rear surface and the heat-dissipating base member.

12. The semiconductor device according to claim 1, wherein the circumferential portion of the bonding portion of the second conductor pattern is upwardly inclined in a direction away from the center portion thereof.

13. The method of manufacturing a semiconductor device according to claim 10, wherein when forming the conductor pattern on the rear surface of the insulating substrate, the conductor pattern is grinded, etched or pressed to form an inclined plane such that the circumferential portion of the bonding portion of the conductor pattern on the rear surface has the thickness less than that of the center of the bonding portion thereof.

14. The method of manufacturing a semiconductor device according to claim 11, wherein when forming the conductor pattern on the rear surface of the insulating substrate, the conductor pattern is grinded, etched or pressed to form an inclined plane such that the circumferential portion of the bonding portion of the conductor pattern on the rear surface has the thickness less than that of the center of the bonding portion thereof.

* * * * *

UNITED STATES PATENT AND TRADEMARK OFFICE
CERTIFICATE OF CORRECTION

| | | |
|---|---|---|
| PATENT NO. | : 9,153,519 B2 | Page 1 of 1 |
| APPLICATION NO. | : 14/110935 | |
| DATED | : October 6, 2015 | |
| INVENTOR(S) | : Fumio Nagaune | |

It is certified that error appears in the above-identified patent and that said Letters Patent is hereby corrected as shown below:

In the Claims

Please change column 6, line 3, from "... base member is" to --... base member 4 is--.

Signed and Sealed this
Ninth Day of February, 2016

Michelle K. Lee
*Director of the United States Patent and Trademark Office*